(12) United States Patent
Saka

(10) Patent No.: US 8,754,458 B2
(45) Date of Patent: Jun. 17, 2014

(54) SEMICONDUCTOR DEVICE, MANUFACTURING METHOD THEREOF, SOLID-STATE IMAGING DEVICE, MANUFACTURING METHOD THEREOF, AND ELECTRONIC UNIT

(75) Inventor: Naoki Saka, Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 13/587,076

(22) Filed: Aug. 16, 2012

(65) Prior Publication Data
US 2013/0049084 A1 Feb. 28, 2013

(30) Foreign Application Priority Data
Aug. 24, 2011 (JP) ................................. 2011-182430

(51) Int. Cl.
*H01L 31/113* (2006.01)
(52) U.S. Cl.
USPC ............... 257/294; 438/282; 438/48; 438/75; 438/60; 438/70
(58) Field of Classification Search
USPC ............ 257/294, 291, E31.083, E21.41, 444, 257/231, 594
See application file for complete search history.

(56) References Cited

U.S. PATENT DOCUMENTS

| | | | | |
|---|---|---|---|---|
| 2006/0275990 A1* | 12/2006 | Itonaga | ........................ | 438/286 |
| 2008/0035963 A1* | 2/2008 | Kwon et al. | ................... | 257/291 |
| 2009/0284630 A1* | 11/2009 | Itonaga | ........................ | 348/294 |

FOREIGN PATENT DOCUMENTS

JP 2006-120679 5/2006

\* cited by examiner

*Primary Examiner* — Chuong A Luu
*Assistant Examiner* — Rodolfo Fortich
(74) *Attorney, Agent, or Firm* — Sheridan Ross P.C.

(57) ABSTRACT

A solid-state imaging device includes an element forming region on the surface of a substrate, element isolating parts that isolate pixels, each of which is formed with a trench and a buried film, an opto-electric conversion element, and a buried-channel MOS transistor. The buried-channel MOS transistor includes a source region and a drain region, formed in the element forming region, that have a conductivity type opposite to that of the element forming region, a channel region having first and second impurity diffusion regions, which have a conductivity type opposite to that of the element forming region, and a gate electrode. Each first impurity diffusion region is formed between the source region and drain region on a side adjacent to one element isolating part. The second impurity diffusion region is formed across the region between the source region and drain region.

16 Claims, 13 Drawing Sheets

SEMICONDUCTOR DEVICE, MANUFACTURING METHOD THEREOF, SOLID-STATE IMAGING DEVICE, MANUFACTURING METHOD THEREOF, AND ELECTRONIC UNIT

BACKGROUND

The present disclosure relates to a semiconductor device having a buried-channel metal oxide semiconductor (MOS) transistor and its manufacturing method, and also relates to a solid-state imaging device and its manufacturing method. Furthermore, the present disclosure relates to an electronic unit that uses the solid-state imaging device.

An ordinary MOS transistor, in the related art, that is formed in a semiconductor device or solid-state imaging device is a surface channel MOS transistor, in which a region below a gate electrode is an impurity region having a conductivity type opposite to the conductivity type of the source and drain region. In the surface channel MOS transistor, when a voltage is applied to the gate electrode, a channel including an inverted layer is formed on the front surface of the semiconductor substrate and current flows between the source region and drain region.

Many carrier traps are formed in the vicinity of the interface between the semiconductor substrate and an insulating film, due to the presence of non-bonded atoms on the front surface of a semiconductor substrate. With the surface-channel MOS transistor, in which a channel region is formed on the front surface of the semiconductor substrate, therefore, mobility and noise characteristics are deteriorated by the carrier traps present in the vicinity of the interface between the semiconductor substrate and the insulating film.

By contrast, buried-channel MOS transistors have been proposed in recent years, in which the channel region is formed at a distance from the front surface of the semiconductor substrate by forming an impurity region having the same conductivity type as the source and drain region formed below the gate electrode. Japanese Unexamined Patent Application Publication No. 2006-120679 describes a technology that reduces noise in an amplifier transistor by using a buried-channel MOS transistor as the amplifier transistor in a complementary metal oxide semiconductor (CMOS) solid-state imaging device.

With the solid-state imaging device, however, it is recognized that image quality is significantly affected by 1/f noise proportional to the frequency generated by the amplifier transistor. The root mean square of a noise voltage is given by equation (1) below (see "CCD/CMOS imeiji sensa no kiso to oyo" (fundamentals and application of the CCD/CMOS image sensor) published by CQ Publishing Co., Ltd.).

$$\overline{V_n^2} = \frac{q^2 d_{ox}^2 n_{Te}}{\varepsilon_{ox}^2 W_{eff} L_{eff} f} \Delta f \quad (1)$$

where $n_{Te}$ is the effective trap density per unit area of the channel, $d_{ox}$ is the thickness of the gate insulating film, $\varepsilon_{ox}$ is the dielectric constant of the gate insulating film, $W_{eff}$ is the effective gate width, $L_{eff}$ is the effective gate length, q is the amount of electric charge of electrons, and f is the frequency. As seen from equation (1), noise can be reduced by increasing the gate length and gate width. To reduce noise in the CMOS solid-state imaging device, therefore, the gate length and gate width of the amplifier transistor have been increased.

In addition to reducing noise, another important issue to the CMOS solid-state imaging device is to suppress dark current. Today's CMOS solid-state imaging devices use the shallow trench isolation (STI) technology by which elements are isolated so that charge photoelectrically converted by a photodiode does not leak into pixel transistors constituting a pixel. When the CMOS solid-state imaging device uses element isolation by STI, the pixel size can be reduced and dark current can be suppressed.

SUMMARY

Recent CMOS solid-state imaging devices have been using much more pixels to obtain higher quality images and pixels have been made more compact to meet cost reduction demands. Even if pixels have been made compact, it is demanded that the saturated amount of charge (Qs) be a certain amount. To meet this demand, a region occupied by a photodiode is difficult to reduce. Accordingly, an active region, in which an amplifier transistor, a reset transistor, a selecting transistor, and the like are formed, has been increasingly demanded to be made compact. This makes it difficult to reduce noise by increasing the gate width and gate length.

In view of the above situation, it is desirable to provide a semiconductor device that reduces noise without changing the size of a MOS transistor. It is also desirable to provide a solid-state imaging device that reduces noise by using the MOS transistor.

The semiconductor device in the present disclosure includes element isolating parts and a buried-channel MOS transistor disposed adjacent to the element isolating parts. Each element isolating part is formed with a trench extending to a desired depth from the front surface of a substrate and a buried film, made of an insulating material, which is buried in the trench. The element isolating parts isolate pixels formed on the substrate. The buried-channel MOS transistor, which is formed in an element forming region on the front surface of the substrate, includes a source region, a drain region, a channel region, and a gate electrode. The source region and drain region, which are formed in the element forming region, are each an impurity region having a conductivity type opposite to the conductivity type of the element forming region. The channel region includes first impurity diffusion regions and a second impurity diffusion region. Each first impurity diffusion region is formed in a region between the source region and the drain region on a side adjacent to one element isolating part. The first impurity diffusion region is an impurity region having the same conductivity type as the source region and drain region. The second impurity diffusion region is formed across the region between the source region and the drain region. The second impurity diffusion region is an impurity region having the same conductivity type as the source region and drain region. The gate electrode is formed on the channel region above the substrate with a gate insulating film disposed between the gate electrode and the channel region.

The solid-state imaging device in the present disclosure is formed in the element forming region. The solid-state imaging device includes an opto-electric conversion element, which creates signal charge according to the amount of incident light, and a buried-channel MOS transistor formed in a region isolated from the opto-electric conversion element by the element isolating part. The buried-channel MOS transistor has the structure described above.

With the semiconductor device and solid-state imaging device in the present disclosure, the first impurity diffusion region is formed, so it is possible to suppress a drop in impurity density, which is caused due to, for example, segregation, pile-up, or diffusion of the impurity on each element isolating part side in the channel region. The first impurity diffusion region also enables a current density in the channel region to be adjusted so that it is fixed on the element isolating part side and the central part.

A method of manufacturing the semiconductor device in the present disclosure includes a step of forming trenches extending to a desired depth from the front surface of a substrate. The method also includes a step of forming first impurity diffusion regions, which become part of a channel region of a buried-channel MOS transistor, by injecting a prescribed impurity through ion implantation at an oblique angle, each first impurity diffusion region being formed on a side wall, facing the channel region, of one trench. The method also includes a step of forming a buried film made of an insulating material in each trench. The method also includes a step of forming a second impurity diffusion region across an entire area that becomes the channel region, by injecting an impurity having the same conductivity type as the first impurity diffusion regions through ion implantation. The method also includes a step of forming a gate electrode on the channel region above the substrate with a gate insulating film disposed between the gate electrode and the channel region. The method also includes a step of forming a source region and a drain region by injecting an impurity having the same conductivity type as the first impurity diffusion regions and second impurity diffusion region, which constitute the channel region, through ion implantation into a substrate region below the gate electrode.

A method of manufacturing the solid-state imaging device in the present disclosure includes a step of forming a photoelectric conversion part, which creates signal charge according to the amount of incident light, by injecting an impurity having the same conductivity type as the first impurity diffusion regions through ion implantation before or after the gate electrode is formed in the above method of manufacturing the semiconductor device.

In the methods of manufacturing the semiconductor device and solid-state imaging device in the present disclosure, since the first impurity diffusion region is formed on each element isolating part side in the channel region, in which segregation, pile-up, diffusion, and the like of an impurity are likely to occur, by injecting ions at an oblique angle, an impurity can be replenished in areas in which the density of the impurity is readily dropped. Accordingly, it becomes possible to prevent the effective gate width from being reduced.

An electronic unit in the present disclosure includes an optical lens, the solid-state imaging device described above, on which light focused by the optical lens is incident, and a signal processing circuit, which processes output signals sent from the solid-state imaging device.

In the semiconductor device and solid-state imaging device in the present disclosure, which have a buried-channel MOS transistor, the channel region can be practically expanded without changing the sizes of the gate electrode. Accordingly, noise can be reduced.

DETAILED DESCRIPTION OF EMBODIMENTS

Examples of a solid-state imaging device in an embodiment of the present disclosure, its manufacturing method, and an electronic unit including the solid-state imaging device in embodiments of the present disclosure will be described below with reference to the drawings. The embodiments will be described in the following order. However, the present disclosure is not limited to the examples described below.

Figure 1:
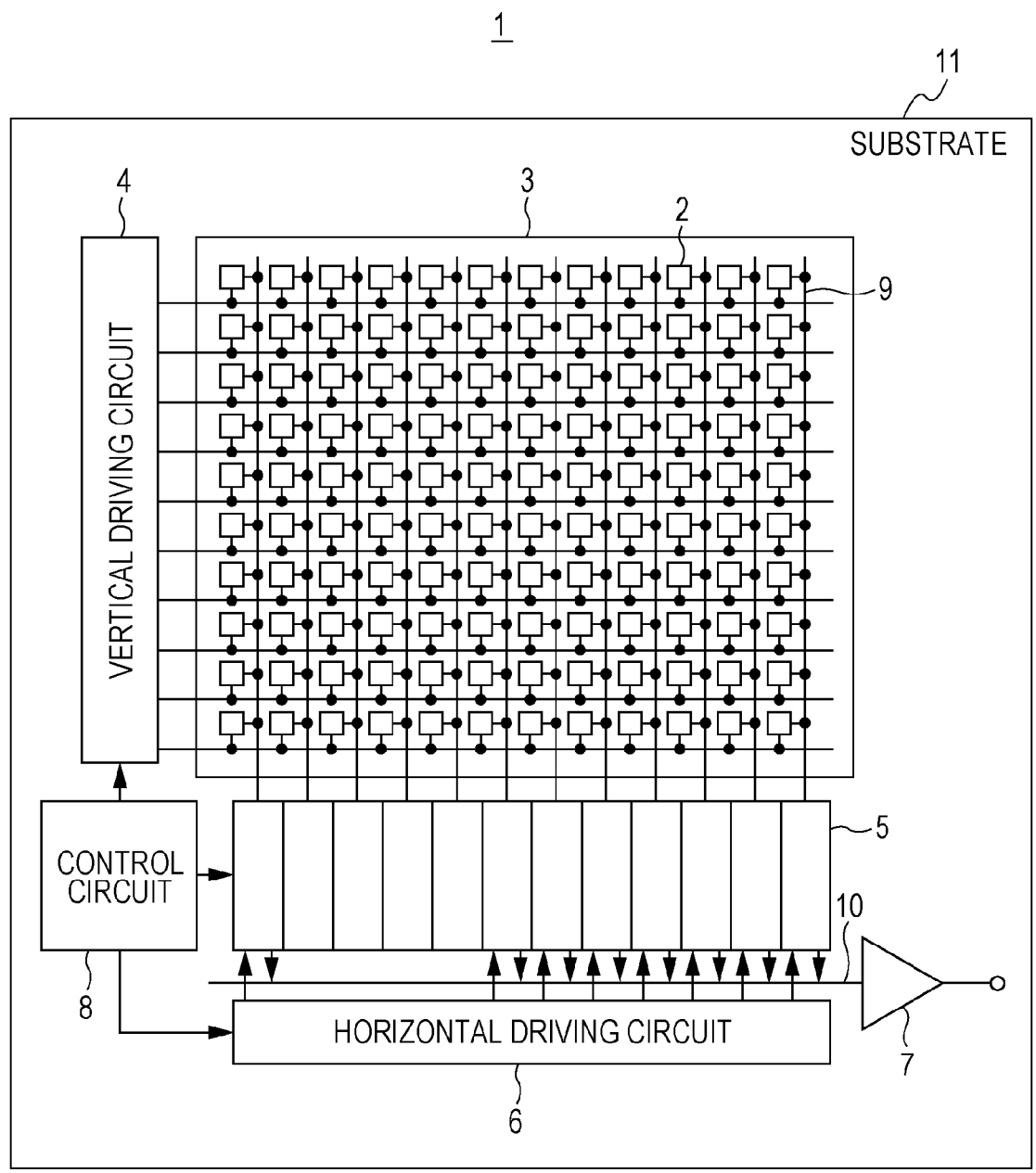
FIG. 1 schematically illustrates the entire structure of a CMOS solid-state imaging device in a first embodiment of the present disclosure.

1. First embodiment: solid-state imaging device
1-1 Entire structure
1-2 Structures of main elements
1-3 Manufacturing method
2. Second embodiment: electronic unit 1. First embodiment: solid-state imaging device
1-1 Entire structure FIG. 1 schematically illustrates the entire structure of a CMOS solid-state imaging device in a first embodiment of the present disclosure.

The solid-state imaging device 1 in this embodiment includes a substrate 11 made of silicon and also includes, on the substrate 11, a pixel region 3 formed with a plurality of pixels 2, a vertical driving circuit 4, a column signal processing circuits 5, a horizontal driving circuit 6, an output circuit 7, a control circuit 8, and other elements.

The plurality of pixels 2, each of which includes an optoelectric conversion element and a plurality of pixel transistors, are regularly placed on the substrate 11 in a two-dimensional array. The pixel transistors included in the pixel 2 may be four MOS transistors that are a transfer transistor, a reset transistor, a selecting transistor, and an amplifier transistor. Alternatively, the pixel transistors may be three transistors excluding the selecting transistor. In this embodiment, the four pixel transistors including the selecting transistor are used.

The pixel region 3 includes the plurality of pixels 2, which are regularly placed in a two-dimensional array. The pixel region 3 includes an effective pixel region, which actually receives light, photoelectrically converts the received light, amplifies the resulting signal charge, and reads out the amplified signal charge to the column signal processing circuits 5, and also has a black reference pixel region (not shown) that outputs optical black, which is a black level reference. The black reference pixel region is usually formed along the outer circumference of the effective pixel region.

The control circuit 8 generates clock signals, control signals, and other signals, with reference to which the vertical driving circuit 4, column signal processing circuits 5, horizontal driving circuit 6, and the like operate, according to vertical synchronization signals, horizontal synchronization signals, and master clocks. The clock signals, controls signals, and other signals generated in the control circuit 8 are input to the vertical driving circuit 4, column signal processing circuits 5, horizontal driving circuit 6, and the like.

The vertical driving circuit 4, which is formed with, for example, a shift register, selectively scans the pixels 2 in the pixel region 3 sequentially one line at a time in the vertical direction. The pixel signal based on the signal charge generated by the photodiode in each pixel 2 according to the amount of light received is supplied to the column signal processing circuits 5 through vertical signal lines 9.

One column signal processing circuits 5 is placed for each column of pixels 2, for example. The column signal processing circuit 5 performs signal processing such as noise removal and signal amplification on signals output from one line of pixels 2 for each pixel column, according to the signal from the black reference pixel region (although not shown, black reference pixel region is formed along the outer circumference of the effective pixel region). At the output stage of the column signal processing circuit 5, a horizontal selection switch (not shown) is provided between it and a horizontal signal line 10.

The horizontal driving circuit 6, which is formed with, for example, a shift register, outputs horizontal scanning pulses sequentially and selects the column signal processing circuits 5 sequentially to have each column signal processing circuit 5 output a pixel signal to the horizontal signal line 10.

The output circuit 7 receives the pixel signal from each column signal processing circuit 5 through the horizontal signal line 10, processes the received signal, and sends an output.

1-2 Structures of Main Elements

Figure 2:
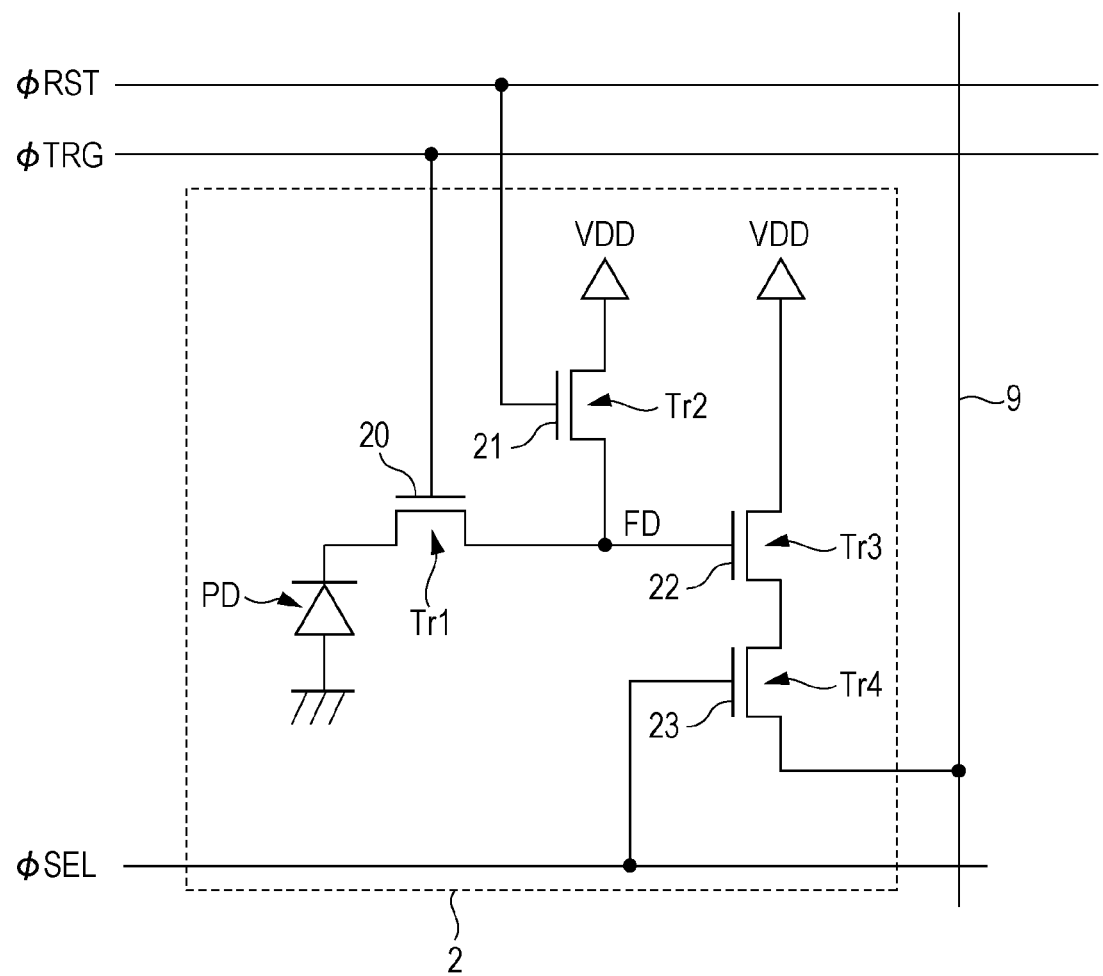
FIG. 2 is an equivalent circuit of a pixel in the solid-state imaging device in the first embodiment of the present disclosure.

FIG. 2 is an equivalent circuit of a pixel in the solid-state imaging device 1 in this embodiment. Each pixel 2 in the solid-state imaging device 1 in this embodiment includes a photodiode PD, which is an opto-electric conversion element, a transfer transistor Tr1, a reset transistor Tr2, an amplifier transistor Tr3, and a selecting transistor Tr4. In this embodiment, these pixel transistors Tr1 to Tr4 are n-channel MOS transistors. The amplifier transistor Tr3, which will be described later, is a buried-channel MOS transistor.

The source of the transfer transistor Tr1 is connected to the cathode of the photodiode PD, and its drain is connected to a floating diffusion part FD. A transfer line, through which transfer pulses φTRG are supplied, is connected to a gate electrode 20 disposed between the source and drain of the transfer transistor Tr1. Signal charge (electrons, in this example) is photoelectrically converted by the photodiode PD and is accumulated in it, after which when a transfer pulse φTRG is applied to the gate electrode 20 of the transfer transistor Tr1, the accumulated signal charge is transferred to the floating diffusion part FD.

The drain of the reset transistor Tr2 is connected to a power supply voltage VDD, and its source is connected to the floating diffusion part FD. A reset line, through which reset pulses φRST are supplied, is connected to a gate electrode 21 disposed between the source and drain of the reset transistor Tr2. A reset pulse φRST is applied to the gate electrode 21 of the reset transistor Tr2 before the signal charge is transferred from the photodiode PD to the floating diffusion part FD. Thus, the potential of the floating diffusion part FD is reset by the power supply voltage VDD to the VDD level.

The drain of the amplifier transistor Tr3 is connected to a power supply voltage Vdd, and its source is connected to the drain of the selecting transistor Tr4. A gate electrode 23 disposed between the source and drain of the amplifier transistor Tr3 is connected to the floating diffusion part FD. The amplifier transistor Tr3 forms a force follower circuit that uses the power supply voltage VDD as a load; the force follower circuit outputs a pixel signal according to a change in the potential of the floating diffusion part FD.

The drain of the selecting transistor Tr4 is connected to the source of the amplifier transistor Tr3, and its source is connected to the relevant vertical signal line 9. A selection line, which supplies selection pulses φSEL, is connected to the gate electrode 23 disposed between the source and drain of the selecting transistor Tr4. When a selection pulse φSEL is supplied to the gate electrode 23 for each pixel, the pixel signal amplified by the amplifier transistor Tr3 is output to the vertical signal line 9.

With the solid-state imaging device 1 structured as described above, when the transfer pulse φTRG is supplied to the gate electrode 20, the signal charge accumulated in the photodiode PD is read out to the floating diffusion part FD by the transfer transistor Tr1. When the signal charge is read out, the potential of the floating diffusion part FD changes, the change in the potential is transmitted to a gate electrode 22. The potential supplied to the gate electrode 22 is amplified by the amplifier transistor Tr3, and the amplified potential is selectively output to the vertical signal line 9 by the selecting transistor Tr4 as a pixel signal.

When the reset pulse φRST is supplied to the gate electrode 22, the signal charge read out by the floating diffusion part FD is reset by the reset transistor Tr2 so as to have the same potential as a potential near the power supply voltage VDD. The pixel signal output to the vertical signal line 9 is then output through the relevant column signal processing circuit 5, horizontal signal line 10, and output circuit 7 shown in FIG. 1.

Figure 3:
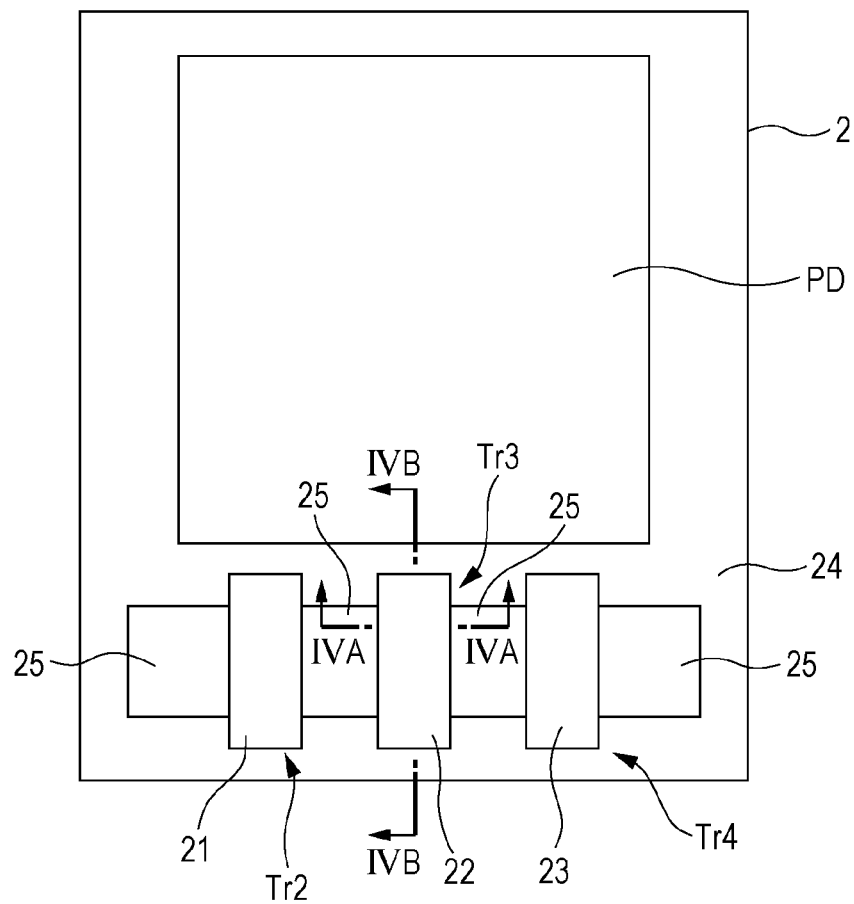
FIG. 3 is a plan view of a unit pixel in the first embodiment of the present disclosure.

FIG. 3 is a plan view of a unit pixel in this embodiment. In FIG. 3, the transfer transistor Tr1 is not shown. As illustrated in FIG. 3, each pixel 2 has the photodiode PD at the center of the unit pixel region, and also has the reset transistor Tr2, amplifier transistor Tr3, and selecting transistor Tr4 are placed in succession in the horizontal direction on the same side as one side of the area in which the photodiode PD is formed.

An active region, which is formed on a semiconductor substrate 12 and includes a source and drain region 25 of the pixel transistors Tr2 to Tr4 and regions below the gate electrodes 21 to 23, is electrically isolated by an element isolating part 24 having a shallow trench isolation (STI) structure described later.

With the solid-state imaging device 1 in this embodiment, it is assumed that the pixel transistors Tr1 to Tr4 are each a buried-channel MOS transistor.

Figure 4A:
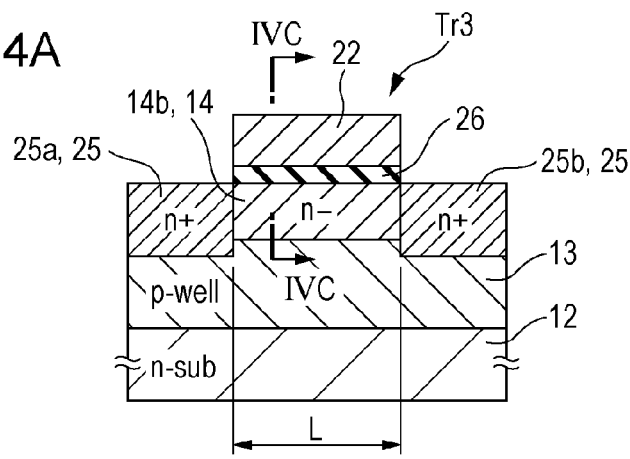
FIG. 4A is a structural diagram illustrating a cross section taken along line IVA-IVA in FIG. 3.
Figure 4B:
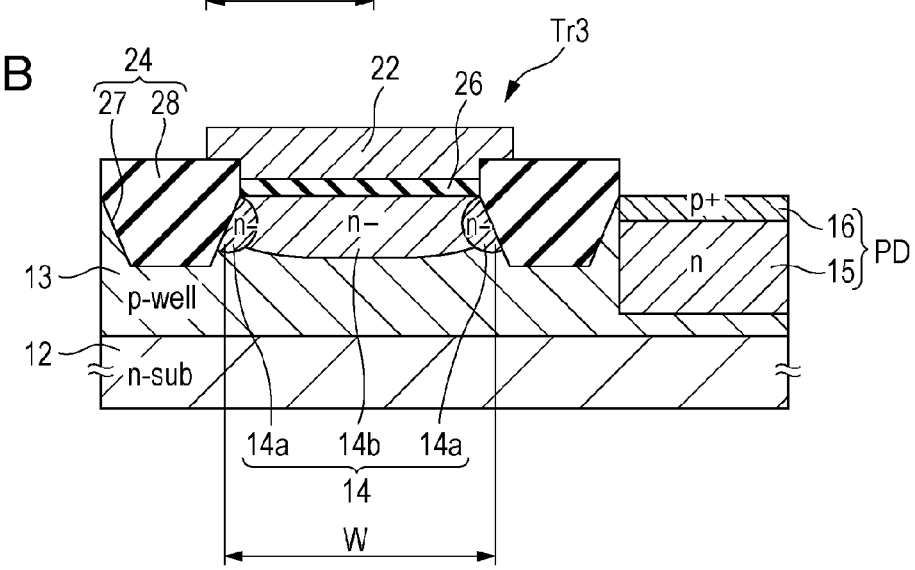
FIG. 4B is a structural diagram illustrating a cross section taken along line IVB-IVB in FIG. 3.

Next, the structure of the amplifier transistor Tr3, which is part of the pixel 2 in this embodiment, will be described. FIG. 4A is a structural diagram illustrating a cross section taken along line IVA-IVA in FIG. 3. FIG. 4B is a structural diagram illustrating a cross section taken along line IVB-IVB in FIG. 3.

As illustrated in FIGS. 4A and 4B, in this embodiment, a well region 13, which becomes an element forming region having a second conductivity type, the p-type, the second conductivity type being the p-type, for example, is formed on the front surface of the semiconductor substrate 12 having a first conductivity type, the first conductivity type being the n type, for example. The pixel transistors (not shown) including the amplifier transistor Tr3 and the photodiode PD are formed in the well region 13.

The amplifier transistor Tr3 has a source region 25a and a drain region 25b, which are formed on the front surface side of the semiconductor substrate 12, as well as the gate electrode 22 formed above the semiconductor substrate 12 between the source region 25a and the drain region 25b. The source region 25a and drain region 25b are formed in the well region 13 formed on the front surface of the semiconductor substrate 12; they are n-type impurity regions.

The gate electrode 22 is formed above the semiconductor substrate 12 with a gate insulating film 26 interposed therebetween, the gate electrode 22 being made of polysilicon, for example, the gate insulating film 26 being a silicon oxide film, for example. A channel region 14, which is an n-type impurity region, is formed on the front surface of the semiconductor substrate 12, which is below the gate electrode 22. The impurity density of the n-type impurity regions (n−) that constitute the channel region 14, is lower than that of n-type impurity regions (n+) that constitute the source region 25a and drain region 25b.

As illustrated in FIG. 4B, the active region including the channel region 14 is electrically isolated by the element isolating parts 24, each of which includes a trench 27 formed on the semiconductor substrate 12 and a buried film 28 buried in the trench 27, the trench 27 and buried film 28 constituting a so-called STI structure. Each trench 27 is formed so as to extend to a desired depth from the front surface of the semiconductor substrate 12. The buried film 28 is formed with an insulating material, which is made of, for example, a silicon oxide film.

Now, the gate width W of the amplifier transistor Tr3 is a distance from one element isolating part 24 to the other element isolating part 24, as illustrated in FIG. 4B. The gate length L is a distance from the inner side end of the source region 25a below the gate electrode 22 to the inner side end of the drain region 25b, as illustrated in FIG. 4A.

In this embodiment, the channel region 14 below the gate electrode 22 includes first impurity diffusion regions 14a, each of which is formed in a region adjacent to one element isolating part 24, and a second impurity diffusion region 14b formed immediately below the gate electrode 22. The first impurity diffusion region 14a is formed through ion implantation at an oblique angle, as described later.

Figure 4C:
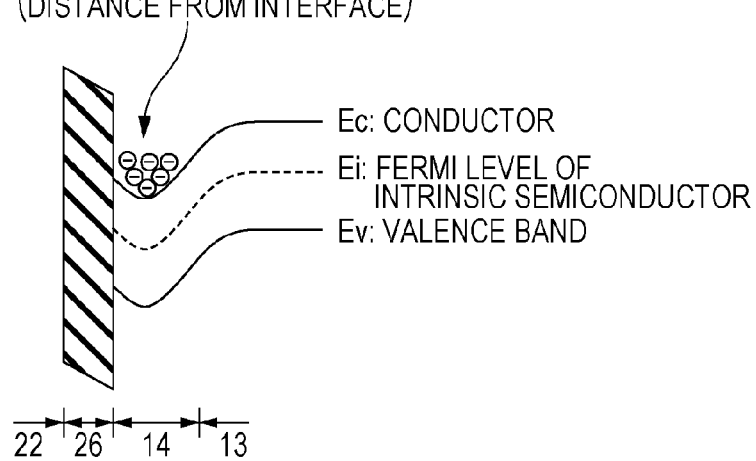
FIG. 4C is a band diagram of the amplifier transistor Tr3 in FIG. 4A, which is taken along line IVC-IVC.

The amplifier transistor Tr3 in this embodiment is a so-called buried-channel MOS transistor; its channel region 14 includes n-type impurity regions having the same conductivity type as the source region 25a and drain region 25b (opposite to the conductivity type of the well region 13 on the semiconductor substrate 12). FIG. 4C is a band diagram of the amplifier transistor Tr3 in FIG. 4A, which is taken along line IVC-IVC.

Figure 5A:
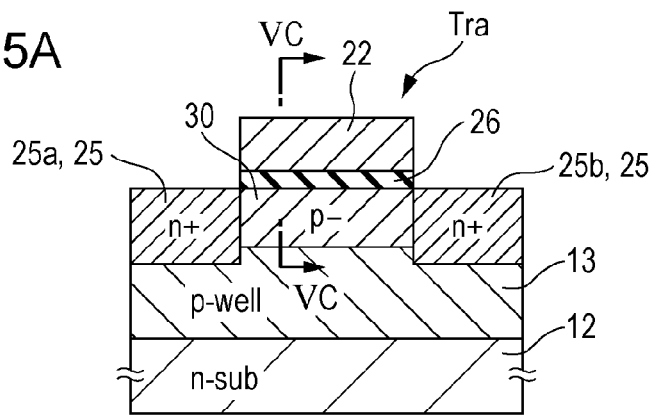
FIG. 5A is a structural diagram illustrating a cross section, in one direction, of a surface-channel MOS transistor Tra in a comparative example.
Figure 5B:
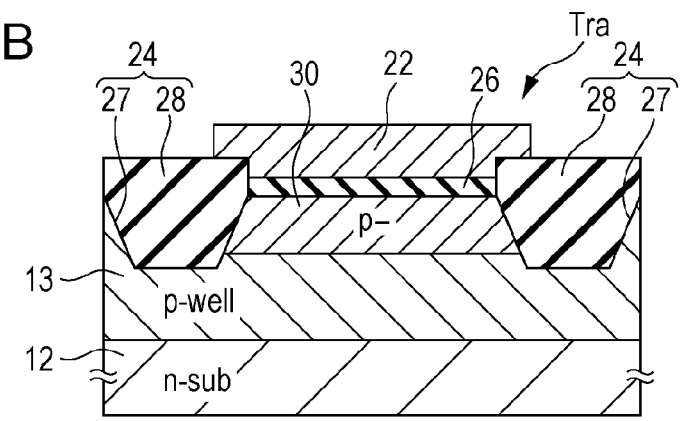
FIG. 5B is a structural diagram illustrating a cross section, in another direction, of the surface-channel MOS transistor Tra.
Figure 5C:
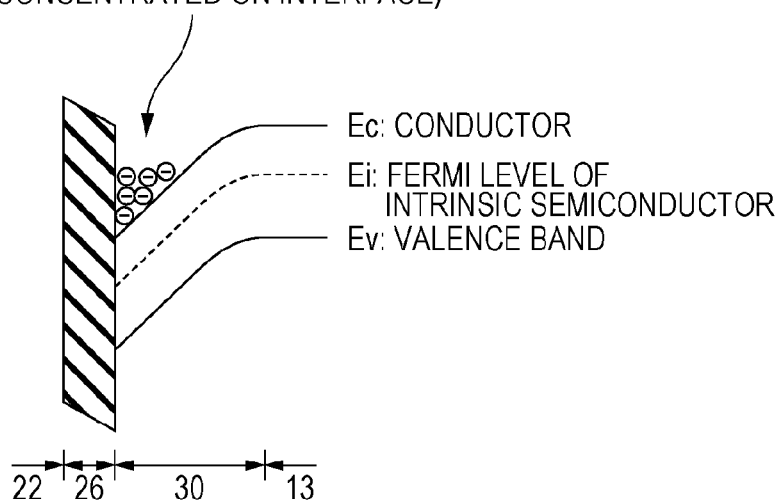
FIG. 5C is a band diagram of the surface-channel MOS transistor Tra in FIG. 5A, which is taken along line VC-VC.

As a comparative example, FIGS. 5A and 5B give structural diagrams illustrating cross sections of an ordinary surface-channel MOS transistor Tra. FIG. 5C is a band diagram of the surface-channel MOS transistor Tra in FIG. 5A, which is taken along line VC-VC. The MOS transistor Tra illustrated in FIGS. 5A and 5B has the same structure as the amplifier transistor Tr3 illustrated in FIGS. 4A and 4B except that a channel region 30 has a different structure from the channel region 14 in FIGS. 4A and 4B, so the same elements are denoted by the same reference characters and repeated descriptions will be omitted. With the MOS transistor Tra in FIGS. 5A and 5B, the channel region 30 below the gate electrode 22 is a p-type impurity diffusion region, the conductivity type of which is the same as that of the well region 13.

With the ordinary surface-channel MOS transistor Tra illustrated in FIGS. 5A and 5B, when a desired voltage is supplied to the gate electrode 22, the potential in the vicinity of the interface between the gate insulating film 26 and the semiconductor substrate 12 changes as illustrated in FIG. 5C, causing current to flow. That is, charge in the channel region 30 of the surface-channel MOS transistor Tra concentrates on the interface between the gate insulating film 26 and the semiconductor substrate 12.

Since many carrier traps have been formed in the vicinity of the interface between the gate insulating film 26 and the semiconductor substrate 12, however, when charge flows on the front surface of the semiconductor substrate 12 as illustrated in FIG. 5C, mobility and noise characteristics are deteriorated.

With the amplifier transistor Tr3 in this embodiment, however, the channel region 14 below the gate electrode 22 is an n-type impurity region, the conductivity type of which is opposite to that of the p-type well region 13 formed on the semiconductor substrate 12. When a desired voltage is applied to the gate electrode 22, therefore, the potential is minimized at a place slightly spaced from the front surface of the semiconductor substrate 12 as illustrated in FIG. 4C. As a result, the charge flows at the place slightly spaced from the interface between the gate insulating film 26 and the semiconductor substrate 12, so the influence of the carrier traps formed in the vicinity of the interface between the gate insulating film 26 and the semiconductor substrate 12 is lessened, enabling improvement of mobility and reduction in noise.

With the amplifier transistor Tr3 in this embodiment, the gate width W can be practically increased due to the first impurity diffusion regions 14a, in the channel region 14 below the gate electrode 22, each of which is formed in a region adjacent to one element isolating part 24. This advantage will be described below in detail.

Figure 6A:
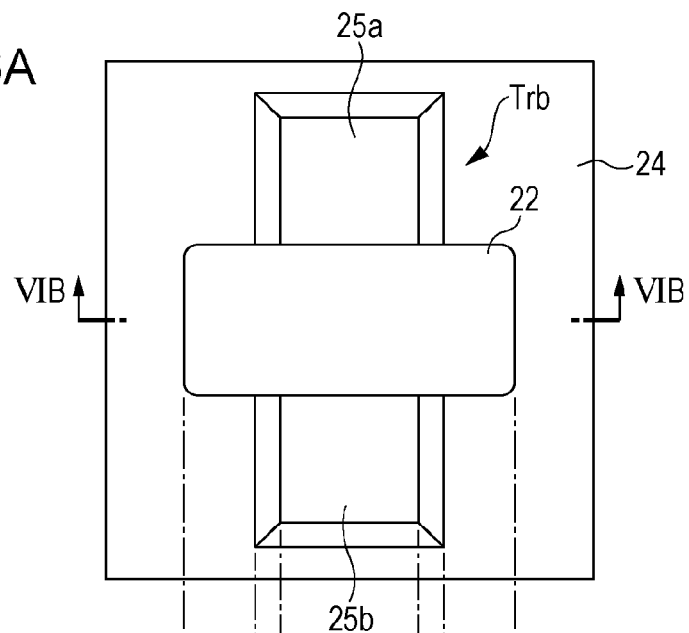
FIG. 6A is a plan view of the structure of a buried-channel MOS transistor Trb in another comparative example.
Figure 6B:
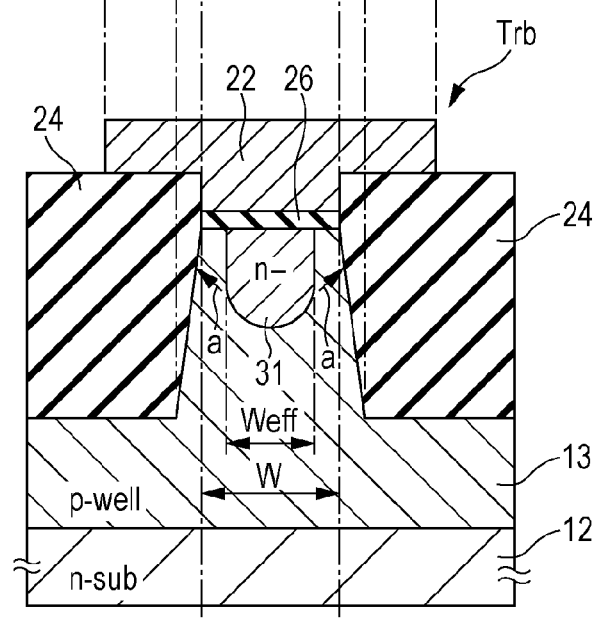
FIG. 6B is a structural diagram illustrating a cross section taken along line VIB-VIB in FIG. 6A.
Figure 6C:
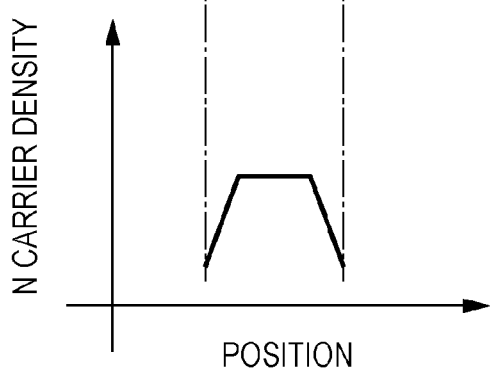
FIG. 6C illustrates an n-carrier density distribution in the channel region in the buried-channel MOS transistor Trb.

FIG. 6A is a plan view of the structure of a buried-channel MOS transistor Trb in the related art as another comparative example. FIG. 6B is a structural diagram illustrating a cross section taken along line VIB-VIB in FIG. 6A. FIG. 6C illustrates an n-carrier density distribution in a channel region 31 in the MOS transistor Trb. The MOS transistor Trb illustrated in FIG. 6A has the same structure as the amplifier transistor Tr3 in this embodiment except only the structure of an impurity diffusion region that constitutes the channel region 31, so elements in FIGS. 6A and 6B that are the same as in FIGS. 4A and 4B are denoted by the same reference characters and repeated descriptions will be omitted.

As illustrated in FIG. 6B, the impurity diffusion region, in the MOS transistor Trb in the comparative example, that constitutes the channel region 31 is formed by forming the element isolating parts 24 and then injecting ions in a direction perpendicular to the semiconductor substrate 12. At the stage of forming the channel region 31, an n-type impurity diffusion region is formed below the gate electrode 22 so that the density is uniformed.

The impurity injected below the gate electrode 22 has properties that the impurity is piled up or segregated on the interface between the semiconductor substrate 12 and each element isolating part 24 and that the impurity diffuses toward the element isolating parts 24 as indicated by the arrows "a" in FIG. 6B by being affected during, for example, heat treatment in the manufacturing process. Even if an impurity diffusion region has been formed below the gate electrode 22 so that the density is uniformed at the stage of forming the channel region 31, therefore, the impurity density in the channel region 31 is lowered near the element isolating parts 24 as illustrated in FIG. 6C. As a result, an inactive region is formed in the vicinity of the interface between the channel region 31 and each element isolating part 24, preventing charge from flowing in the inactive region. Accordingly, the actual active region in the buried-channel MOS transistor Trb in the relate art is narrowed and the effective width Weff is smaller than the gate width W, which is equal to the width of the gate electrode 22.

As described above, the effective width Weff of the buried-channel MOS transistor Trb in the related art is smaller than the assumed gate width W because inactive areas are formed due to the diffusion of the impurities toward the element isolating parts 24. As is clear from equation (1) as well, this reduction in the gate width causes mobility and noise characteristics to be deteriorated. The smaller the estimated gate width W is, the larger the relative effect of the change in the effective width Weff on the entire estimated gate width W becomes, resulting in a larger impact by the noise. Therefore, as the size of the pixel is reduced, the inactive regions are more affected.

With the amplifier transistor Tr3 in this embodiment, however, the first impurity diffusion region 14a is formed on a surface adjacent to the element isolating part 24 in the channel region 14 below the gate electrode 22, through ion implantation at an oblique angle. As a result, the impurity involved in the carrier density is replenished in each first impurity diffusion region 14a; the carrier density would otherwise be lowered in the manufacturing process because the impurity included in the channel region 14 is piled up or segregated near the element isolating parts 24 or diffuses toward the element isolating parts 24. Thus, in the amplifier transistor Tr3 in this embodiment, which is a buried-channel MOS transistor, the effective width Weff can be maintained at the ideal gate width W, which is equal to the width of the gate electrode 22.

1-3 Manufacturing Method

Next, the method of manufacturing the solid-state imaging device 1 in this embodiment will be described. FIGS. 7A to 10K illustrate steps in the manufacturing of a region in which the amplifier transistor Tr3 is formed.

Figure 7A:
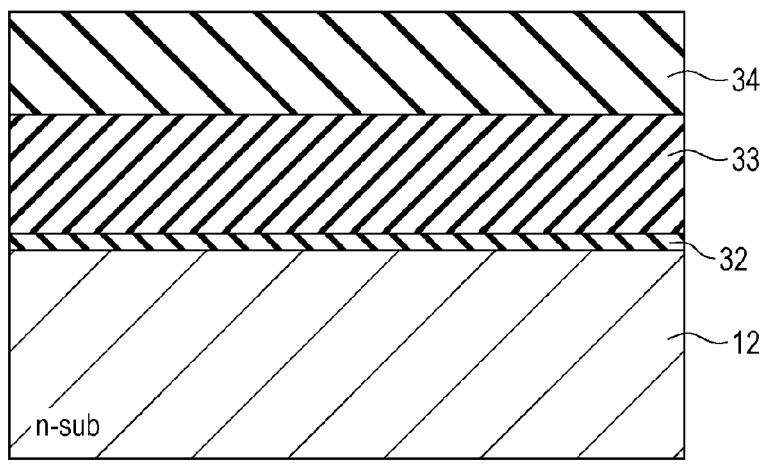
FIGS. 7A to 7C illustrate steps (part 1) in a method of manufacturing the solid-state imaging device in the first embodiment of the present disclosure.

First, as illustrated in FIG. 7A, the semiconductor substrate 12, which is, for example, of the n-type, is prepared, after which the silicon oxide film 32 with a thickness of 2 to 20 nm is formed on the semiconductor substrate 12. Then, a silicon nitride film 33 with a thickness of 50 to 100 nm is formed on the silicon oxide film 32 and a low-temperature silicon nitride film, which is a tetra ethyl ortho silicate (TEOS) film 34, with a thickness of 50 to 200 nm is formed on the silicon nitride film 33.

Figure 7B:
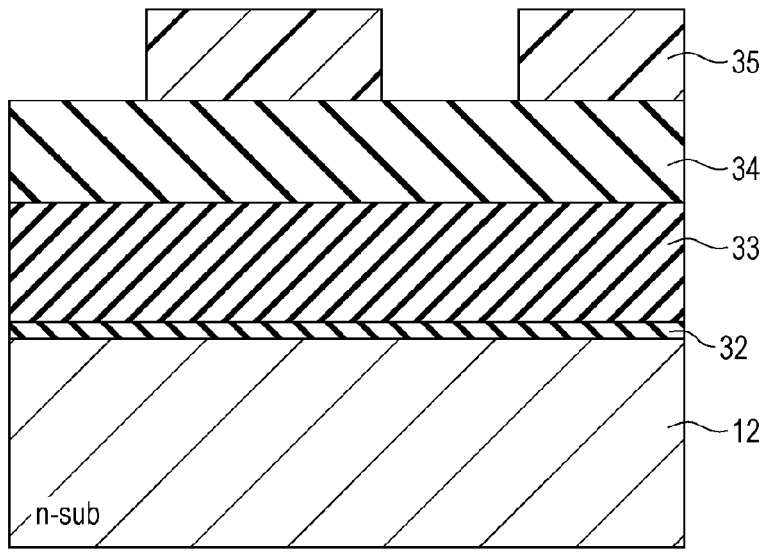

Next, a resist layer is formed on the entire upper surface of the TEOS film 34, and the resist layer is exposed to light and developed by using the photolithography technology, forming a resist mask 35 as a pattern as illustrated in FIG. 7B, the resist mask 35 having an opening through which a region below which to form the element isolating part 24 is left exposed.

Figure 7C:
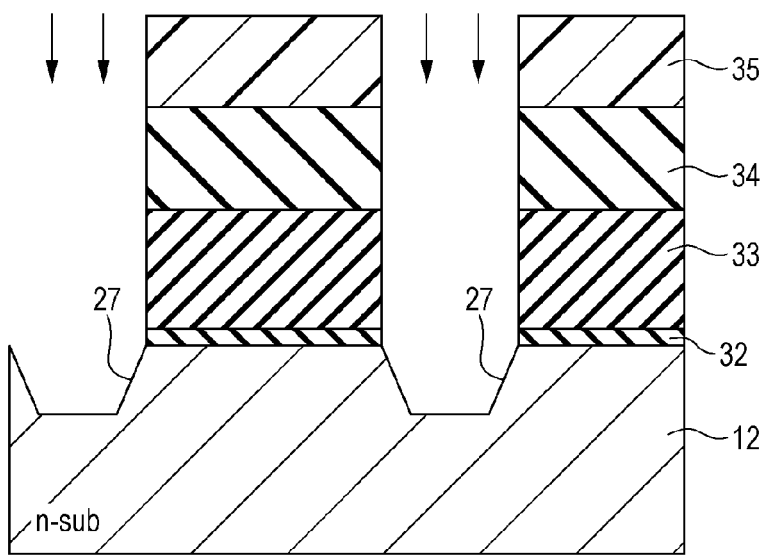

Next, as illustrated in FIG. 7C, the TEOS film 34 and silicon nitride film 33 are etched by using the resist mask 35 as a mask. The silicon oxide film 32 and semiconductor substrate 12 are then etched by using the silicon nitride film 33 and TEOS film 34, which have been opened, as a mask. The trench 27 is then formed by performing etching removal to a desired depth (50 to 300 nm, for example) from the front surface of the semiconductor substrate 12.

Figure 8D:
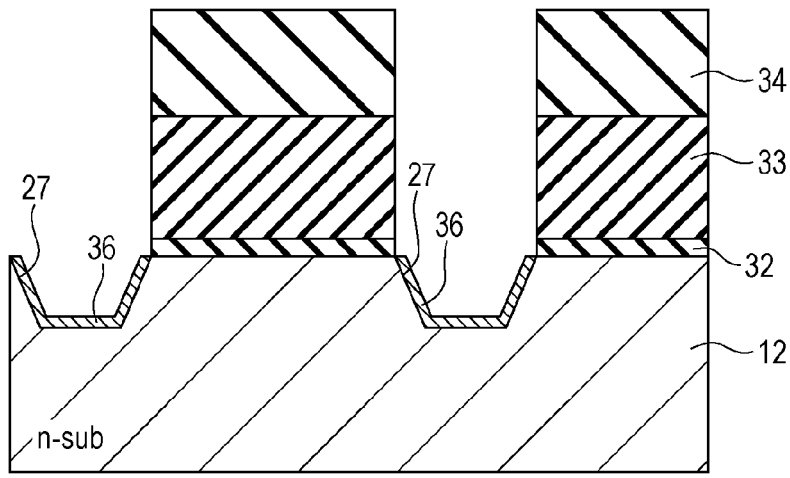
FIGS. 8D to 8F illustrate steps (part 2) in the method of manufacturing the solid-state imaging device in the first embodiment of the present disclosure.

Next, as illustrated in FIG. 8D, the bottom and side walls of the trench 27 formed in the semiconductor substrate 12 are oxidized by, for example, thermal oxidation to form an oxide film 36 with a thickness of 2 to 20 nm.

Figure 8E:
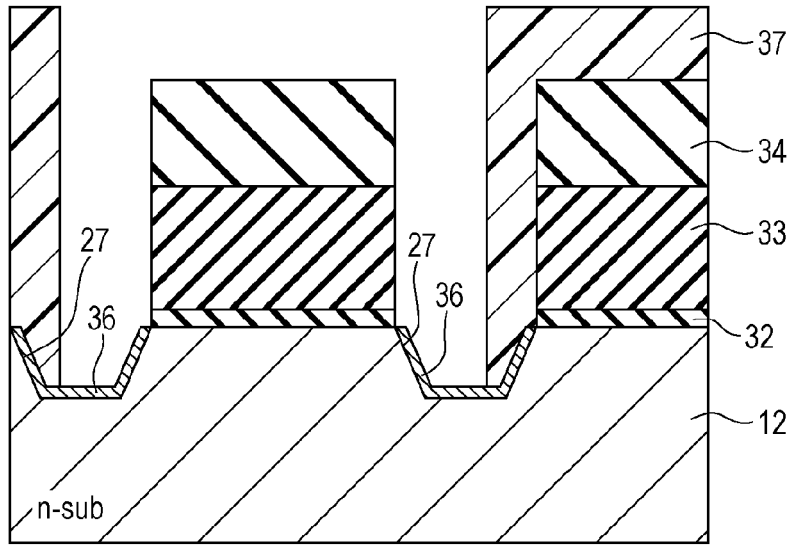

Next, as illustrated in FIG. 8E, a resist mask 37 is formed so that the side wall of the trench 27 on the side on which the channel region 14 of the amplifier transistor Tr3 is to be formed is left exposed.

Figure 8F:
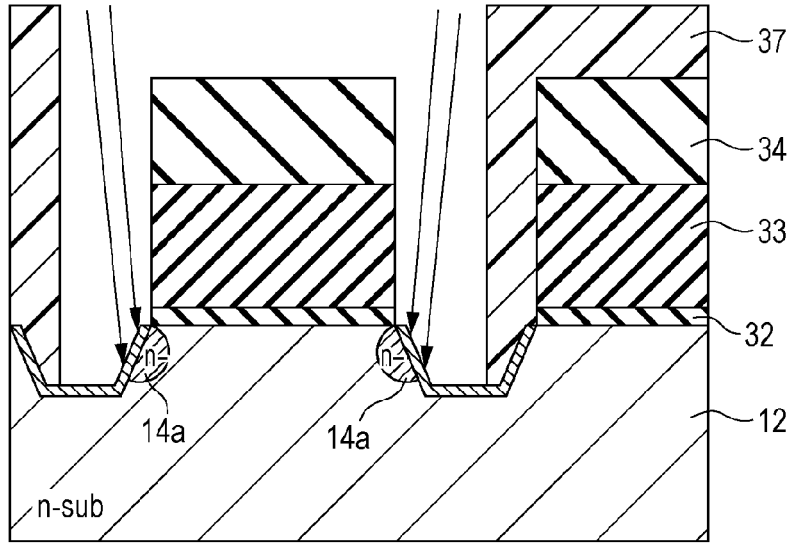

Then, as illustrated in FIG. 8F, an n-type impurity such as, for example, phosphor (P) and/or arsenic (As) is injected by ion implantation at an oblique angle through the resist mask 37 under the conditions that supplied energy is to several tens of kiloelectron volts (keV) and the amount of dose is $1 \times 10^{11}$ to $1 \times 10^{13}$ (cm$^{-2}$). Thus, the first impurity diffusion region 14a is formed on the open side wall of the trench 27. The first impurity diffusion region 14a may be formed by one ion implantation or a plurality of ion implantations. The first impurity diffusion region 14a may be formed to the same depth as the second impurity diffusion region 14b, which is formed in a later process; for example, the first impurity diffusion region 14a may be formed to a depth of 5 to 100 nm from the front surface of the semiconductor substrate 12. At this stage, the element isolating part 24 formed with the trench 27 and buried film 28 is formed.

Figure 9G:
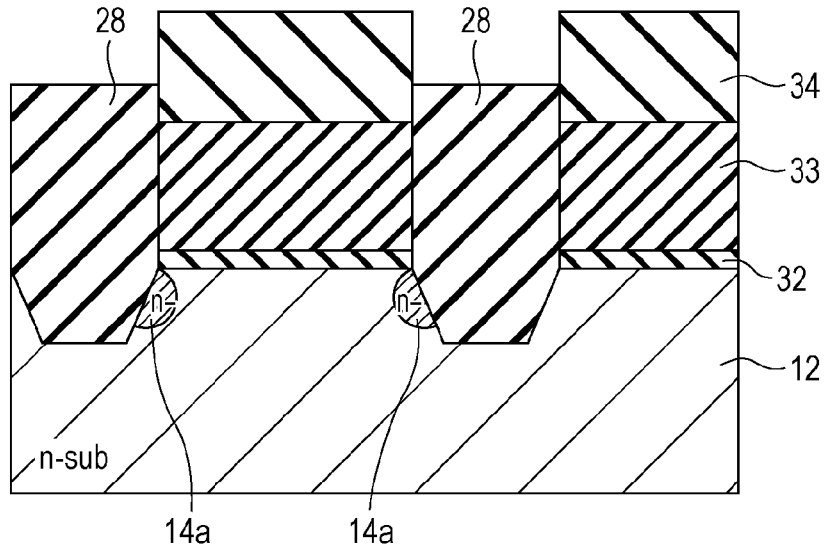
FIGS. 9G to 9I illustrate steps (part 3) in the method of manufacturing the solid-state imaging device in the first embodiment of the present disclosure.

Next, as illustrated in FIG. 9G, the buried film 28 made of a silicon oxide film is formed by using the chemical vapor deposition (CVD) method so as to fill the trench 27. In FIG. 9G and later drawings, the oxide film 36 formed in FIG. 8D is omitted.

Figure 9H:
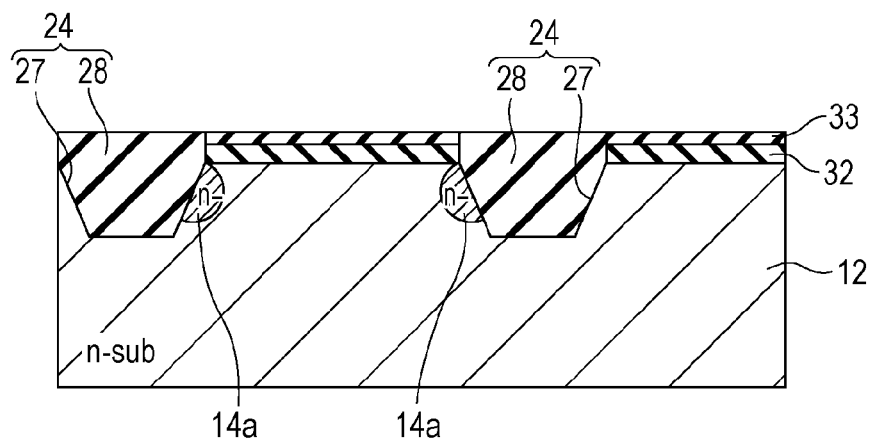

As illustrated in FIG. 9H, the upper surface of the TEOS film 34 is then polished by the chemical mechanical polishing (CMP) method so as to expose the silicon nitride film 33 and polishing is continued until the height of the buried film 28 becomes a desired value.

Figure 9I:
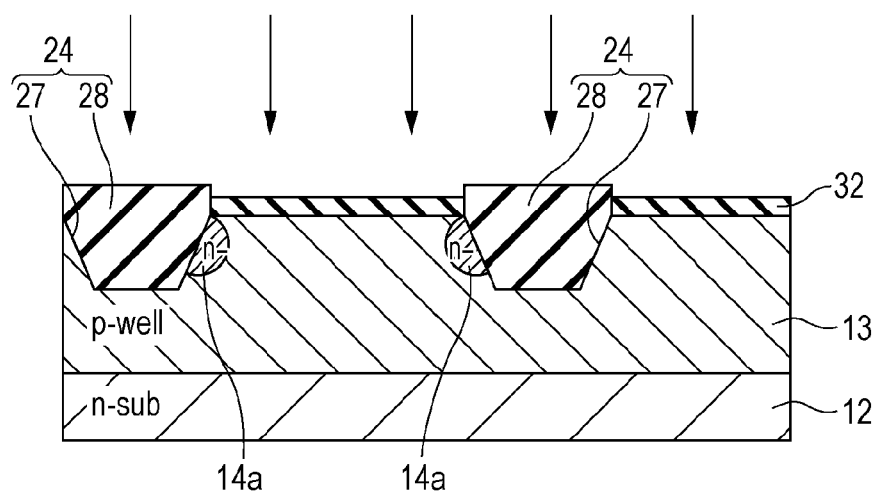

Next, as illustrated in FIG. 9I, the silicon nitride film 33 is removed, after which the well region 13 of p-type is formed by performing ion implantation of a p-type impurity such as, for example, boron (B) toward the front surface of the semiconductor substrate 12 in a region in which a pixel will be formed. The well region 13 is located at a position deeper in the depth direction than the region in which the photodiode PD and pixel transistors Tr1 to Tr4 will be formed.

Figure 10J:
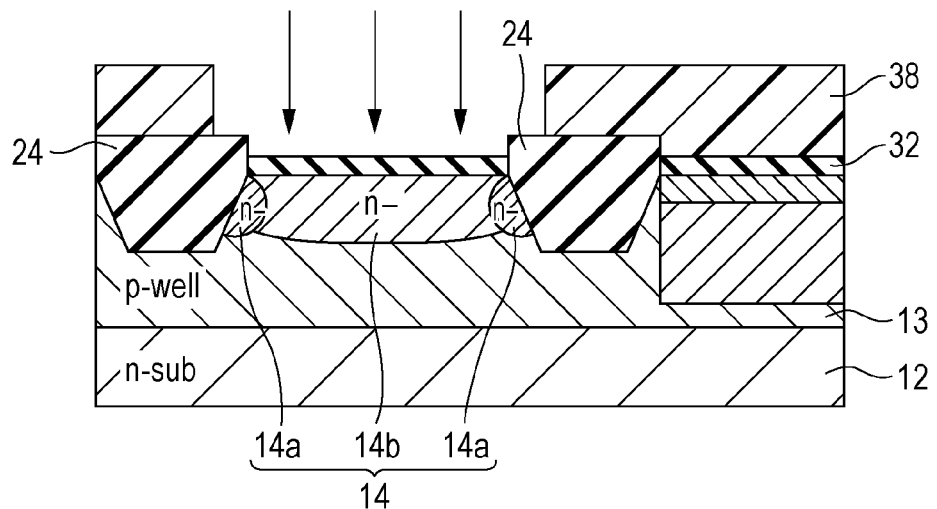
FIGS. 10J and 10K illustrate steps (part 4) in the method of manufacturing the solid-state imaging device in the first embodiment of the present disclosure.

Next, as illustrated in FIG. 10J, a resist mask 38 having an opening through which the channel region 14 of the amplifier transistor Tr3 is left exposed is formed. In this case, the opening of the resist mask 38 may be formed so that its ends on the same side as the element isolating part 24 are positioned on the element isolating part 24. An n-type impurity such as, for example, phosphor (P) and/or arsenic (As) is injected by ion implantation through the resist mask 38 under the conditions that supplied energy is several tens of kiloelectron volts (keV) and the amount of dose is $1\times10^{11}$ to $1\times10^{13}$ ($cm^{-2}$). Thus, the second impurity diffusion region 14b is formed at a depth of 5 to 100 nm from the front surface of the semiconductor substrate 12. Here, the second impurity diffusion region 14b in the channel region 14 is formed by self-alignment, in which the element isolating part 24 is used as a mask, on the same side as the element isolating part 24.

The channel region 14 is formed with the first impurity diffusion regions 14a and second impurity diffusion region 14b, the conductivity type of the channel region 14 being opposite to that of the p-type well region 13.

In this embodiment, on the same side as each element isolating part 24 in the channel region 14, after the first impurity diffusion region 14a has been formed, the second impurity diffusion region 14b is formed, so the first impurity diffusion region 14a can have a higher impurity density than the central part of the channel region 14. Accordingly, the first impurity diffusion region 14a can be formed on a side adjacent to one element isolating part so that even if the impurity is piled up or segregated near the element isolating part 24 or diffuses, the impurity density in the first impurity diffusion region 14a is equal to or higher than that at the center of the channel region 14.

The n-type impurity included in the first impurity diffusion region 14a may be the same as the n-type impurity included in the second impurity diffusion region 14b, or these two impurities may be of different types.

Figure 10K:
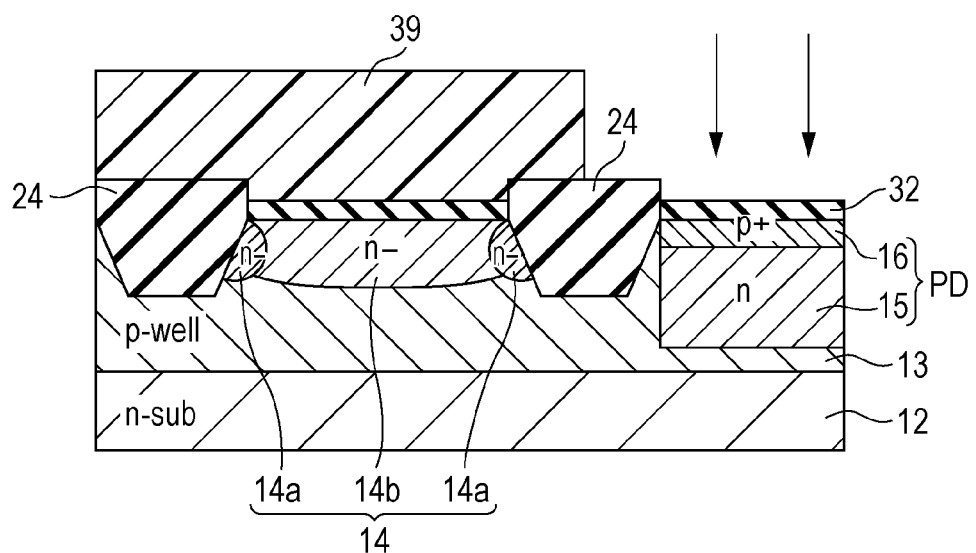

Next, the resist mask 38, which has been used to form the second impurity diffusion region 14b, is removed, after which a resist mask 39 having an opening through which a region below which to form the photodiode PD is left exposed is formed, as illustrated in FIG. 10K. An n-type impurity is injected by ion implantation to a desired depth through the resist mask 39, forming an n-type semiconductor region, which becomes a charge accumulating layer 15 of the photodiode PD. A p-type impurity is then injected at high density by ion implantation to the topmost surface of the semiconductor substrate 12 through the resist mask 39, forming a p-type semiconductor region, which becomes a dark current suppression region 16. Thus, the photodiode PD is formed.

Next, the silicon oxide film 32 is removed and a new silicon oxide film, which becomes the gate insulating film 26, is formed above the front surface of the semiconductor substrate 12. The gate electrode 22 made of polysilicon the formed as a pattern above the channel region 14, and the source and drain region 25, in which the pixel transistors Tr1 to Tr4 are included, is formed. Thus, the solid-state imaging device 1 in this embodiment illustrated in FIGS. 4A and 4B is formed.

With the solid-state imaging device 1 in this embodiment, after the trench 27 has been formed, the first impurity diffusion region 14a is formed on the side wall of the trench 27 by ion implantation at an oblique angle. In this formation of the first impurity diffusion region 14a, the n-type impurity is injected in consideration of the amount by which the density of the n-type impurity is lowered due to its segregation, pile-up, or diffusion in the vicinity of the element isolating part 24 having an STI structure. Thus, in this embodiment, a region that has been inactive in the vicinity of the element isolating part 24 in the buried-channel MOS transistor in the related art becomes an active region, so the practical channel width W is increased.

As described above, with the amplifier transistor Tr3 in this embodiment, the channel width W can be increased without changing the shape of the gate electrode 22, as compared with the buried-channel MOS transistor in the related art.

Figure 11A:
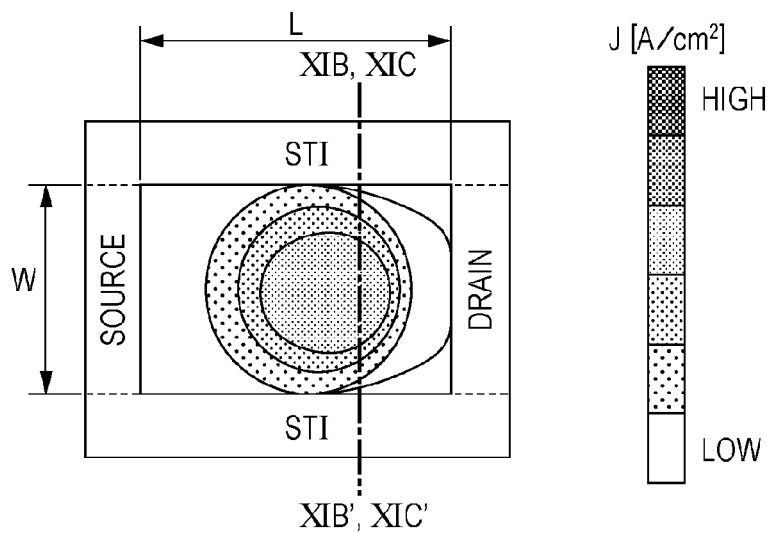
FIG. 11A illustrates the current density distribution of the amplifier transistor Tr3 in the first embodiment of the present disclosure in a plan direction.

FIG. 11A illustrates the current density distribution of the amplifier transistor Tr3, which is a buried-channel MOS transistor, in this embodiment in a plan direction.

Figure 11B:
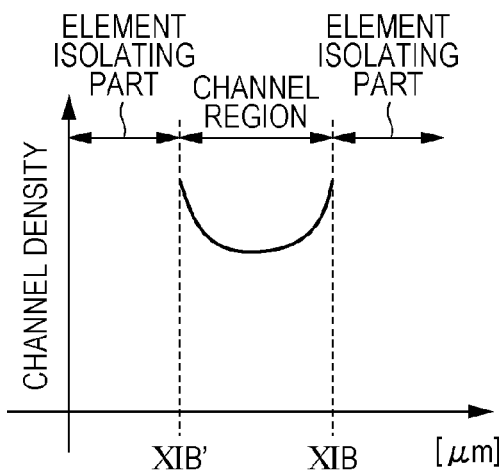
FIG. 11B is a graph of the channel density on the cross section taken along line XIB-XIB' in FIG. 11A.
Figure 11C:
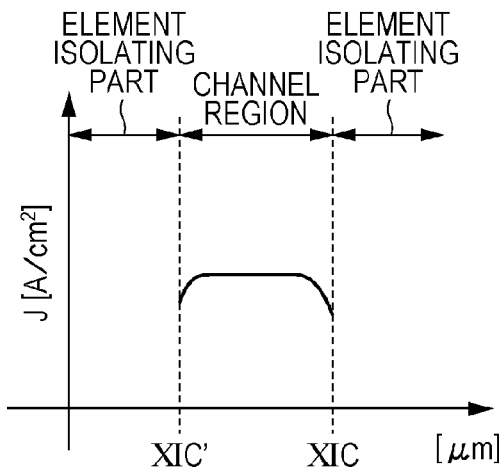
FIG. 11C is a graph of the current density distribution on the cross section taken along line XIB-XIB' in FIG. 11A.

FIG. 11B is a graph of the channel density on the cross section taken along line XIB-XIB' in FIG. 11A. FIG. 11C is a graph of the current density distribution on the cross section taken along line XIC-XIC' in FIG. 11A.

Figure 12A:
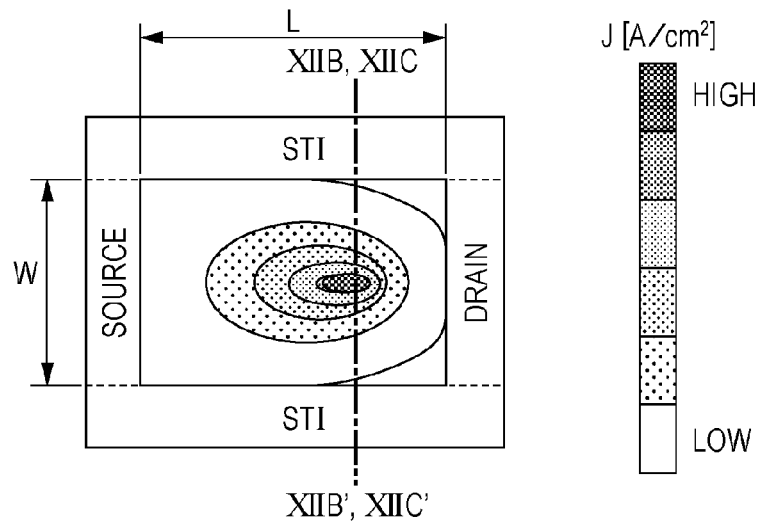
FIG. 12A illustrates the current density distribution of the buried-channel MOS transistor Trb in the above comparative example in a plan direction.
Figure 12B:
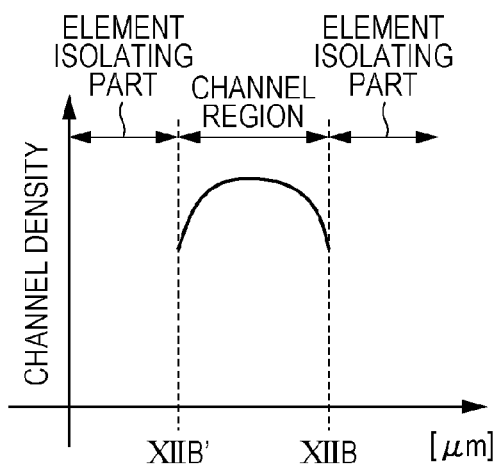
FIG. 12B is a graph of the channel density on the cross section taken along line XIIB-XIIB' in FIG. 12A.
Figure 12C:
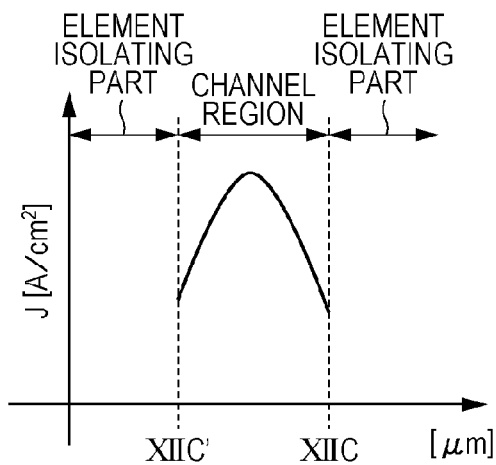
FIG. 12C is a graph of the current density distribution on the cross section taken along line XIIB-XIIB' in FIG. 12A.

FIG. 12A illustrates the current density distribution of the buried-channel MOS transistor Trb (FIG. 6A) in the comparative example in a plan direction. FIG. 12B is a graph of the channel density on the cross section taken along line XIIB-XIIB' in FIG. 12A. FIG. 12C is a graph of the current density distribution on the cross section taken along line XIIC-XIIC' in FIG. 12A.

As illustrated in FIG. 12B, with the buried-channel MOS transistor in the comparative example, the impurity density is lowered due to segregation or pile-up in the vicinity of each element isolating part 24 and the channel region 31 is thereby inactivated on the same side as each element isolating part 24. Thus, as illustrated in FIGS. 12A and 12C, the current density is distributed in an inverted-V shape, in which the closer to the center current is, the higher the current density is. In this case, many electrons feel potential from traps generated by non-bonded atoms on the front surface of the semiconductor substrate 12, so noise is increased.

With the amplifier transistor Tr3, which is a buried-channel MOS transistor, in this embodiment, however, the impurity density is increased in the channel region 14 on the same side as each element isolating part 24 by an amount involved in the formation of the first impurity diffusion region 14a, as illustrated in FIG. 11B. This causes the current density to be substantially fixed in the channel width direction. Thus, the charge in the channel region 14 flows uniformly and less electrons feel the potential from the traps present on the front surface of the semiconductor substrate 12, reducing noise.

Although, in this embodiment, the impurity density in the channel region 14 is higher near the element isolating parts 24 than at the center or the impurity density near the element isolating parts 24 is substantially the same as at the center, this is not a limitation. As seen from equation (1) described above, noise can be reduced by increasing the channel width W. When current flows uniformly in the channel region 14, however, carriers' trap sensitivity drops and noise characteristics are thereby improved. Accordingly, a further important issue is to have current flow uniformly in the channel region 14. Just to uniform the impurity density in the channel region 14 is not enough. It is important to adjust the amount of impurity to be injected in the channel region 14 toward each element isolating part 24 at a time when the buried-channel MOS transistor has been created so that the current density is uniformly distributed in the channel region 14.

As described above, in this embodiment, a buried-channel MOS transistor is used as the amplifier transistor Tr3, which is part of the pixel 2, and the first impurity diffusion regions 14a and second impurity diffusion region 14b constitute the channel region 14. Since the impurity can be replenished into regions where the impurity density is likely to be lowered, the channel region 14 can be practically expanded without changing the size of the gate electrode 22 and noise can thereby be reduced.

Although this embodiment has been descried by using an example in which an n-channel MOS transistor is used as the amplifier transistor Tr3, a p-channel MOS transistor may be used instead. If a p-channel MOS transistor is used, it suffices to change the first conductivity type to the p-type and change the second conductivity type to the n-type. Although this embodiment has also been described by using an example in which a p-well region, which is a p-type element forming region, has been formed on an n-type semiconductor substrate and an element such as a MOS transistor has been formed on the p-well region, this is not a limitation. For example, an n-type MOS transistor may be formed on a p-type semiconductor substrate instead and other various variations are possible.

Although, in this embodiment, a buried-channel MOS transistor has been used as the amplifier transistor Tr3, it may also be used as other pixel transistors such as, for example, the reset transistor Tr2 and selecting transistor Tr4. Although, in this embodiment, a pixel has been formed with four pixel transistors including the selecting transistor Tr4, a pixel can also be formed with the remaining three pixel transistors excluding the selecting transistor Tr4.

When a pixel is formed with the four pixel transistors including the selecting transistor Tr4, the selecting transistor Tr4 functions as a switch, so the amplifier transistor Tr3 may be a normally closed (depressed) field-effect transistor (FET) or a normally open transistor. Although, in this embodiment, the transfer transistor Tr1, reset transistor Tr2, and selecting transistor Tr4 have also been buried-channel MOS transistor, only the amplifier transistor Tr3 may be a buried-channel MOS transistor and the other pixel transistors may be a surface-channel pixel transistor as illustrated in FIG. 5.

The present disclosure can be applied not only to solid-state imaging devices that sense a distribution of the amount of incident visible light and captures it as an image but also to solid-state imaging devices that capture a distribution of the amount of infrared rays, X-rays, or particles as an image. In a broad sense, the present disclosure can also be applied to solid-state imaging devices used as general physical quantity distribution detecting devices, such as fingerprint detection sensors, that sense a distribution of pressure, a capacitance, or another physical quantity and captures it as an image.

Furthermore, the present disclosure is not limited to solid-state imaging devices that scan unit pixels in the pixel part sequentially one line at a time and read out a pixel signal from each unit pixel. The present disclosure can also be applied to X-Y address-type solid-state imaging devices, which select one arbitrary pixel at a time and read out a signal from the selected pixel on a per-pixel unit.

The solid-state imaging device may be formed as a single chip or as a module that has imaging functions implemented by combining a pixel part and a signal processing part or optical system together as a module.

The present disclosure can be applied not only to solid-state imaging devices but also to semiconductor devices having a buried-channel MOS transistor and other imaging devices. The imaging devices include camera systems such as digital still cameras and digital video cameras and electronic units such as mobile telephones having an imaging function. The above-mentioned module to be mounted in an electronic unit, that is, a camera module, may be considered to be an imaging device.

2. Second embodiment: electronic unit

Figure 13:
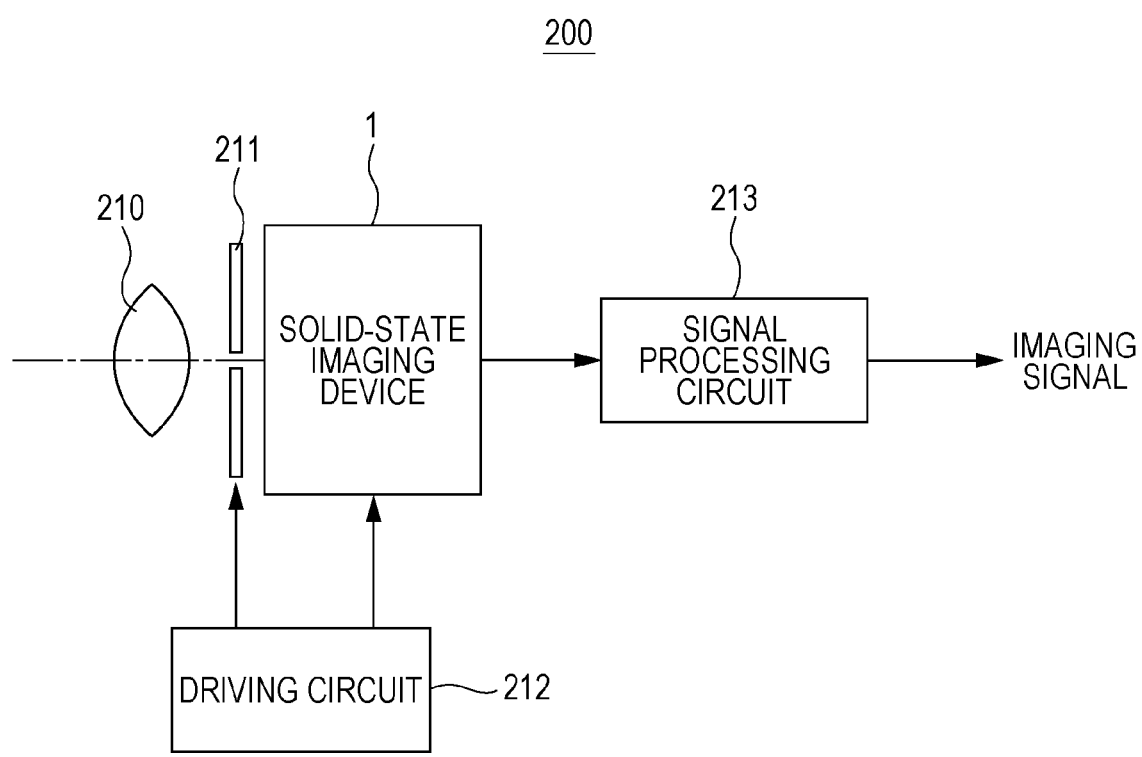
FIG. 13 schematically illustrates the structure of an electronic unit in a second embodiment of the present disclosure.

Next, an electronic unit in a second embodiment of the present disclosure will be described. FIG. 13 schematically illustrates the structure of the electronic unit 200 in the second embodiment of the present disclosure.

The electronic unit 200 in this embodiment includes a solid-state imaging device 1, an optical lens 210, a shutter 211, a driving circuit 212, and a signal processing circuit 213. The electronic unit 200 in this embodiment has a camera; in this embodiment, the solid-state imaging device 1 in the first embodiment described above is used as the solid-state imaging device 1.

The optical lens 210 focuses image light (incident light) received from a subject on an imaging surface of the solid-state imaging device 1. Thus, the signal charge is accumulated in the solid-state imaging device 1 over a fixed period.

The shutter 211 controls a period during which light is directed to the solid-state imaging device 1 and a period during which light is blocked.

The driving circuit 212 supplies driving signals that control a transfer operation performed by the solid-state imaging device 1 and a shutter operation performed by the shutter 211. The solid-state imaging device 1 transfers signals in response to the driving signals (timing signals) supplied from the driving circuit 212. The signal processing circuit 213 carries out various types of signal processing. Video signals on which signal processing has been carried out are stored on a storage medium such as a memory or are output to a monitor.

With the electronic unit 200 in this embodiment, image quality is improved because noise in the pixel region in the solid-state imaging device 1 is reduced.

The electronic unit 200 in which the solid-state imaging device 1 can be used is not limited to a camera, but it may be an imaging device such as a camera module intended for a mobile unit such as a mobile telephone.

The present disclosure can also have structures described below.

(1)

A solid-state imaging device that includes an element forming region formed on the front surface of a substrate, element isolating parts that isolate pixels formed on the substrate, each element isolating part being formed with a trench extending to a desired depth from the front surface of the substrate and a buried film, made of an insulating material, which is buried in the trench, an opto-electric conversion element, formed in the element forming region, that generates signal charge according to the amount of incident light, and a buried-channel MOS transistor formed in a region isolated from the opto-electric conversion element by the element isolating parts;

the buried-channel MOS transistor includes a source region and a drain region, which are formed in desired regions in the element forming region and are each an impurity region having a conductivity type opposite to the conductivity type of the element forming region; the buried-channel MOS transistor also includes a channel region having first impurity diffusion regions and a second impurity diffusion region, each first impurity diffusion region being an impurity region having a conductivity type opposite to the conductivity type of the element forming region and being formed in a region between the source region and the drain region on a side adjacent to one element isolating part, the second impurity diffusion region being an impurity region having the same conductivity type as the first impurity diffusion regions and being formed across the region between the source region and the drain region; the buried-channel MOS transistor also includes a gate electrode, which is formed on the channel region above the substrate with a gate insulating film disposed between the gate electrode and the channel region.

(2)

In the solid-state imaging device described in (1) above, the buried-channel MOS transistor constitutes an amplifier transistor.

(3)

In the solid-state imaging device described in (1) or (2) above, the first impurity diffusion regions and second impurity diffusion region are formed at substantially the same depth in the substrate.

(4)

A method of manufacturing a solid-state imaging device includes forming trenches extending to a desired depth from the front surface of a substrate, forming first impurity diffusion regions, which become part of a channel region of a buried-channel MOS transistor, by injecting a prescribed impurity through ion implantation at an oblique angle, each first impurity diffusion region being formed on a side wall, facing the channel region, of one trench, forming a buried film made of an insulating material in each trench, forming a second impurity diffusion region across an entire area that becomes the channel region, by injecting an impurity having the same conductivity type as the first impurity diffusion regions through ion implantation, forming a gate electrode on the channel region above the substrate with a gate insulating film disposed between the gate electrode and the channel region, forming a source region and a drain region by injecting an impurity, which has the same conductivity type as the first impurity diffusion regions and second impurity diffusion region, which constitute the channel region, through ion implantation into a substrate region below the gate electrode, and forming a photoelectric conversion part, which creates signal charge according to the amount of incident light, by injecting an impurity having the same conductivity type as the first impurity diffusion regions through ion implantation before or after the gate electrode is formed.

(5)

In the method of manufacturing a solid-state imaging device described in (4) above, the buried-channel MOS transistor constitutes an amplifier transistor.

(6)

In the method of manufacturing a solid-state imaging device described in (4) or (5) above, the first impurity diffusion regions and second impurity diffusion region are formed at substantially the same depth.

(7)

A semiconductor device that includes element isolating parts that isolate pixels formed on a substrate, each element isolating part being formed with a trench extending to a desired depth from the front surface of the substrate and a buried film, made of an insulating material, which is buried in the trench, an element forming region formed on the front surface of the substrate, and a buried-channel MOS transistor that includes a source region and a drain region, which are formed in desired regions in the element forming region and are each an impurity region having a conductivity type opposite to the conductivity type of the element forming region, includes a channel region having first impurity diffusion regions and a second impurity diffusion region, each first impurity diffusion region being an impurity region having a conductivity type opposite to the conductivity type of the element forming region and being formed in a region between the source region and the drain region on a side adjacent to one element isolating part, the second impurity diffusion region being an impurity region having the same conductivity type as the first impurity diffusion regions and being formed across the region between the source region and the drain region, and also includes a gate electrode, which is formed on the channel region above the substrate with a gate insulating film disposed between the gate electrode and the channel region.

(8)

In the semiconductor device described in (7) above, the first impurity diffusion regions and second impurity diffusion region are formed at substantially the same depth in the substrate.

(9)

A method of manufacturing a semiconductor device includes forming trenches extending to a desired depth from the front surface of a substrate, forming first impurity diffusion regions, which become part of a channel region of a buried-channel MOS transistor, by injecting a prescribed impurity through ion implantation at an oblique angle, each first impurity diffusion region being formed on a side wall, facing the channel region, of one trench, forming a buried film made of an insulating material in each trench, forming a second impurity diffusion region across an entire area that becomes the channel region, by injecting an impurity having the same conductivity type as the first impurity diffusion regions through ion implantation, forming a gate electrode on the channel region above the substrate with a gate insulating film disposed between the gate electrode and the channel region, and forming a source region and a drain region by injecting an impurity, which has the same conductivity type as the first impurity diffusion regions and second impurity diffusion region, which constitute the channel region, through ion implantation into a substrate region below the gate electrode.

(10)

In the method of manufacturing a semiconductor device described in (9) above, the first impurity diffusion regions and second impurity diffusion region are formed at substantially the same depth.

(11)

An electronic unit that includes an optical lens, a solid-state imaging device that includes an element forming region formed on the front surface of a substrate, element isolating parts that isolate pixels formed on the substrate, each element isolating part being formed with a trench extending to a desired depth from the front surface of the substrate and a buried film, made of an insulating material, which is buried in the trench, an opto-electric conversion element, formed in the element forming region, that generates signal charge according to the amount of incident light, and a buried-channel MOS transistor formed in a region isolated from the opto-electric conversion element by the element isolating part, the buried-channel MOS transistor including a source region and a drain region, which are formed in desired regions in the element forming region and are each an impurity region having a conductivity type opposite to the conductivity type of the element forming region, the buried-channel MOS transistor also including a channel region having first impurity diffusion regions and a second impurity diffusion region, each first impurity diffusion region being an impurity region having a conductivity type opposite to the conductivity type of the element forming region and being formed in a region between the source region and the drain region on a side adjacent to one element isolating part, the second impurity diffusion region being an impurity region having the same conductivity type as the first impurity diffusion regions and being formed across the region between the source region and the drain region, the buried-channel MOS transistor also including a gate electrode, which is formed on the channel region above the substrate with a gate insulating film disposed between the gate electrode and the channel region, light focused by the optical lens being incident on the solid-state imaging device, and a signal processing circuit, which processes output signals sent from the solid-state imaging device.

(12)

In the electronic unit described in (11) above, the buried-channel MOS transistor constitutes an amplifier transistor.

(13)

In the electronic unit described in (11) or (12) above, the first impurity diffusion regions and second impurity diffusion region are formed at substantially the same depth.

The present disclosure contains subject matter related to that disclosed in Japanese Priority Patent Application JP 2011-182430 filed in the Japan Patent Office on Aug. 24, 2011, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device comprising:
   a substrate;
   an element forming region formed on a front surface of the substrate;
   element isolating parts that isolate pixels formed on the substrate, each element isolating part being formed with a trench extending to a desired depth from the front surface of the substrate and a buried film, made of an insulating material, which is buried in the trench;
   an opto-electric conversion element, formed in the element forming region, that generates signal charge according to the amount of incident light; and
   a buried-channel MOS transistor formed in a region isolated from the opto-electric conversion element by the element isolating parts, the buried-channel MOS transistor including
      a source region and a drain region, which are formed in desired regions in the element forming region and are each an impurity region having a conductivity type opposite to the conductivity type of the element forming region,
      a channel region extending between the element isolating parts, the channel region having first impurity diffusion regions and a second impurity diffusion region, each first impurity diffusion region being an impurity region having a conductivity type opposite to the conductivity type of the element forming region and being formed in a region between the source region and the drain region on a side adjacent to one element isolating part, the second impurity diffusion region being an impurity region having the same conductivity type as the first impurity diffusion regions and being formed across the region between the source region and the drain region, and
      a gate electrode, which is formed on the channel region above the substrate with a gate insulating film disposed between the gate electrode and the channel region.

2. The solid-state imaging device according to claim 1, wherein the buried-channel MOS transistor constitutes an amplifier transistor.

3. The solid-state imaging device according to claim 2, wherein the first impurity diffusion regions and the second impurity diffusion region are formed at substantially the same depth in the substrate.

4. A method of manufacturing a solid-state imaging device comprising:
   forming trenches extending to a desired depth from a front surface of a substrate;
   forming first impurity diffusion regions, which become part of a channel region of a buried-channel MOS transistor, by injecting a prescribed impurity through ion implantation at an oblique angle, each first impurity diffusion region being formed on a side wall, facing the channel region, of one trench;
   forming a buried film made of an insulating material in each trench;
   forming a second impurity diffusion region across an entire area that becomes the channel region, by injecting an impurity having the same conductivity type as the first impurity diffusion regions through ion implantation, wherein the first and second impurity diffusion regions of the channel region extend between the trenches;
   forming a gate electrode on the channel region above the substrate with a gate insulating film disposed between the gate electrode and the channel region;
   forming a source region and a drain region by injecting an impurity, which has the same conductivity type as the first impurity diffusion regions and second impurity diffusion region, which constitute the channel region, through ion implantation into a substrate region below the gate electrode; and
   forming a photoelectric conversion part, which creates signal charge according to the amount of incident light, by injecting an impurity having the same conductivity type as the first impurity diffusion regions through ion implantation before or after the gate electrode is formed.

5. The method of manufacturing a solid-state imaging device according to claim 4, wherein the buried-channel MOS transistor constitutes an amplifier transistor.

6. The method of manufacturing a solid-state imaging device according to claim 5, wherein the first impurity diffusion regions and the second impurity diffusion region are formed at substantially the same depth in the substrate.

7. A semiconductor device comprising:
   a substrate;
   element isolating parts that isolate pixels formed on the substrate, each element isolating part being formed with a trench extending to a desired depth from the front surface of the substrate and a buried film, made of an insulating material, which is buried in the trench;
   an element forming region formed on a front surface of the substrate; and
   a buried-channel MOS transistor that includes
      a source region and a drain region, which are formed in desired regions in the element forming region and are each an impurity region having a conductivity type opposite to the conductivity type of the element forming region,
      a channel region extending between the element isolating parts, the channel region having first impurity diffusion regions and a second impurity diffusion region, each first impurity diffusion region being an impurity region having a conductivity type opposite to the conductivity type of the element forming region and being formed in a region between the source region and the drain region on a side adjacent to one element isolating part, the second impurity diffusion region being an impurity region having the same conductivity type as the first impurity diffusion regions and being formed across the region between the source region and the drain region, and a gate electrode, which is formed on the channel region above the substrate with a gate insulating film disposed between the gate electrode and the channel region.

8. The semiconductor device according to claim 7, wherein the first impurity diffusion regions and the second impurity diffusion region are formed at substantially the same depth in the substrate.

9. A method of manufacturing a semiconductor device comprising:

forming trenches extending to a desired depth from a front surface of a substrate;

forming first impurity diffusion regions, which become part of a channel region of a buried-channel MOS transistor, by injecting a prescribed impurity through ion implantation at an oblique angle, each first impurity diffusion region being formed on a side wall, facing the channel region, of one trench;

forming a buried film made of an insulating material in each trench;

forming a second impurity diffusion region across an entire area that becomes the channel region, by injecting an impurity having the same conductivity type as the first impurity diffusion regions through ion implantation, wherein the first and second impurity diffusion regions of the channel region extend between the trenches;

forming a gate electrode on the channel region above the substrate with a gate insulating film disposed between the gate electrode and the channel region; and forming a source region and a drain region by injecting an impurity, which has the same conductivity type as the first impurity diffusion regions and second impurity diffusion region, which constitute the channel region, through ion implantation into a substrate region below the gate electrode.

10. The method of manufacturing a semiconductor device according to claim 9, wherein the first impurity diffusion regions and the second impurity diffusion region are formed at substantially the same depth in the substrate.

11. An electronic unit comprising:

an optical lens;

a solid-state imaging device that includes an element forming region formed on the front surface of a substrate, element isolating parts that isolate pixels formed on the substrate, each element isolating part being formed with a trench extending to a desired depth from the front surface of the substrate and a buried film, made of an insulating material, which is buried in the trench, an opto-electric conversion element, formed in the element forming region, that generates signal charge according to the amount of incident light, and a buried-channel MOS transistor formed in a region isolated from the opto-electric conversion element by the element isolating part, the buried-channel MOS transistor including a source region and a drain region, which are formed in desired regions in the element forming region and are each an impurity region having a conductivity type opposite to the conductivity type of the element forming region, a channel region extending between the element isolating parts, the channel region having first impurity diffusion regions and a second impurity diffusion region, each first impurity diffusion region being an impurity region having a conductivity type opposite to the conductivity type of the element forming region and being formed in a region between the source region and the drain region on a side adjacent to one element isolating part, the second impurity diffusion region being an impurity region having the same conductivity type as the first impurity diffusion regions and being formed across the region between the source region and the drain region, and a gate electrode, which is formed on the channel region above the substrate with a gate insulating film disposed between the gate electrode and the channel region, light focused by the optical lens being incident on the solid-state imaging device; and a signal processing circuit, which processes output signals sent from the solid-state imaging device.

12. The electronic unit according to claim 11, wherein the buried-channel MOS transistor constitutes an amplifier transistor.

13. The electronic unit according to claim 12, wherein the first impurity diffusion regions and the second impurity diffusion region are formed at substantially the same depth in the substrate.

14. The solid-state imaging device according to claim 1, wherein a first one of the first impurity diffusion regions of the channel region is in contact with a first one of the element isolating parts, and wherein a second one of the first impurity diffusion regions of the channel region is in contact with a second one of the element isolating parts.

15. The semiconductor device according to claim 7, wherein a first one of the first impurity diffusion regions of the channel region is in contact with a first one of the element isolating parts, and wherein a second one of the first impurity diffusion regions of the channel region is in contact with a second one of the element isolating parts.

16. The electronic unit according to claim 11, wherein a first one of the first impurity diffusion regions of the channel region is in contact with a first one of the element isolating parts, and wherein a second one of the first impurity diffusion regions of the channel region is in contact with a second one of the element isolating parts.

* * * * *